United States Patent [19]
Yamagata

[11] Patent Number: 5,552,637
[45] Date of Patent: Sep. 3, 1996

[54] SEMICONDUCTOR DEVICE

[75] Inventor: Osamu Yamagata, Kawashaki, Japan

[73] Assignee: Kabushiki Kaisha Toshiba, Kawasaki, Japan

[21] Appl. No.: 455,037

[22] Filed: May 31, 1995

Related U.S. Application Data

[63] Continuation of Ser. No. 258,829, Jun. 13, 1994, abandoned.

[30] Foreign Application Priority Data

Jun. 14, 1993 [JP] Japan .................................... 5-165961

[51] Int. Cl.⁶ .......................... H01L 23/34; H01L 23/48; H01L 23/52; H01L 29; H01L 40
[52] U.S. Cl. .......................... 257/717; 257/753; 257/759; 257/782; 257/783
[58] Field of Search .................................... 257/666, 717, 257/753, 759, 782, 783, 723

[56] References Cited

U.S. PATENT DOCUMENTS

| | | | |
|---|---|---|---|
| 4,303,934 | 12/0181 | Stitt | 257/753 |
| 4,459,607 | 7/1986 | Reid | 257/753 |
| 4,901,137 | 2/1990 | Sato et al. | 257/717 |
| 5,199,164 | 4/1993 | Kim et al. | 257/712 |

FOREIGN PATENT DOCUMENTS

| | | | |
|---|---|---|---|
| 3116859 | 5/1991 | Japan | 257/717 |
| 4-11757 | 1/1992 | Japan . | |
| 4-12557 | 1/1992 | Japan . | |
| 4048769 | 2/1992 | Japan | 257/723 |

*Primary Examiner*—Sara W. Crane
*Assistant Examiner*—Jhihan Clark
*Attorney, Agent, or Firm*—Finnegan, Henderson, Farabow, Garrett & Dunner, L.L.P.

[57] ABSTRACT

There is provided a composite semiconductor device having a structure for bonding a wiring board to a package so as to satisfy both of the high thermal conductivity and low elasticity at the same time. The wiring board is fixed on the inner bottom surface of the ceramic package of alumina or the like on which a heat radiating plate is mounted by use of an adhesive agent. A plurality of semiconductor chips such as a CPU and memory are mounted on the wiring board. The chip is fixed on the wiring board by use of an adhesive agent of high thermal conductivity. As most part of the adhesive agent for fixing the wiring board on the package, an adhesive agent of low elasticity is used and an adhesive agent of high thermal conductivity is used in an area below a portion of the wiring board on which the chip is mounted. The stress caused in the interface by a difference between the thermal expansion coefficients of the wiring board and the package when heat is generated from the chip can be efficiently reduced by the adhesive agent of low elasticity since the adhesive agent of high thermal conductivity is applied only in the extremely limited area.

3 Claims, 5 Drawing Sheets

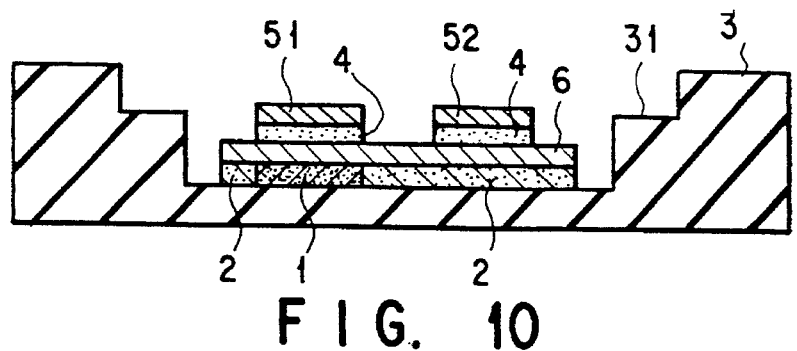
F I G. 10
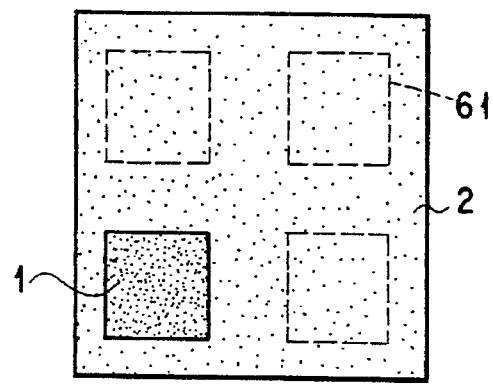
F I G. 11
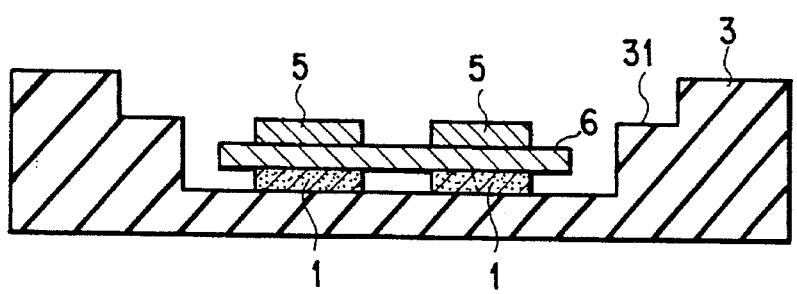
F I G. 12
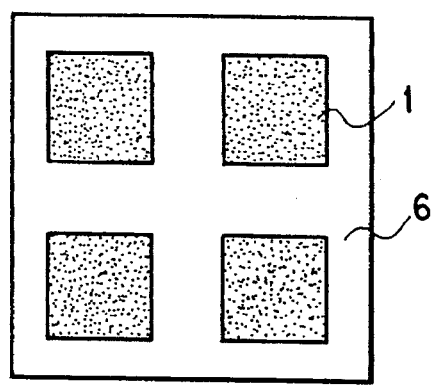
F I G. 13

SEMICONDUCTOR DEVICE

This is a continuation of application Ser. No. 08/258,829 filed Jun. 13, 1994, now abandoned.

BACKGROUND OF THE INVENTION

1. Field of the Invention

This invention relates to a composite semiconductor device, and more particularly to a connection between a large-scale high density semiconductor substrate which is required to have high thermal conductivity and low thermal stress and a semiconductor package for protecting the same.

2. Description of the Related Art

In semiconductor devices such as IC, LSI, packaging is effected in order to protect a semiconductor substrate (which is hereinafter referred to as a semiconductor chip) having semiconductor elements formed therein from contamination sources such as dusts, chemicals, moisture which give bad influences and mechanical breakage. A package used for packaging is required to have air-tightness, good resistance to the high-temperature heating process in the assembling process, high mechanical strength, chemical stability, good electrical properties such as insulation and high-frequency characteristics, and the like. As the material of the package, synthetic resin, ceramic, glass, metal or the like may be used. When a ceramic package is used, a semiconductor chip (which is hereinafter simply referred to as a chip) is generally fixed on the inner bottom surface of the package which is open by use of adhesive agent of synthetic resin, and then a cap of ceramic, for example, is mounted on the opening portion of the package so as to hermetically seal the package. As the scale of the information processing device is increased and the operation speed thereof is enhanced it is more required to develop semiconductor devices suitable as the information processing device. In order to meet the above requirement, a multichip module (MCM) which is a composite semiconductor device is provided. The multichip module is constructed by a large silicon substrate (which is hereinafter referred to as a wiring substrate) of 50 mm square on which circuit wirings such as multi-layered wirings are formed and semiconductor chips such as a memory chip and CPU (central processing unit) fixed on the substrate. Since wirings between the chips are extremely short, a semiconductor device having high operation speed and high integration density can be obtained.

Next, mounting of a conventional MCM type semiconductor device is explained with reference to FIGS. 1A to 4. FIGS. 3 and 4 are a cross sectional view and a plan view of the semiconductor device after completion, FIG. 1B is a plan view of the semiconductor device, and FIGS. 1B and 2 are cross sectional views thereof. A package 3 is rectangular and a stepped portion 31 is formed in the inner peripheral portion thereof. Further, the package has connection wirings (not shown) formed therein and the wirings are exposed on the stepped portion 31. Electrode pins 32 for mounting the semiconductor device on a circuit board (not shown) such as a printed wiring board are formed in the peripheral portion of the package 3. The electrode pins 32 are connected to the connection wirings in the package. A heat radiation plate 9 is fixed on the rear surface of the package 3 by an adhesive agent 8. The wiring board 6 is fixed on the inner bottom surface of the package 3 by an adhesive agent 2. Further, chips 5 such as a CPU and memory element, for example, SRAM are mounted on the front surface of the wiring board 6 by an adhesive agent 4. In order to connect the chips 5 to each other, bonding wires 7 of aluminum or gold are formed to connect the chips 5 to the wiring board 6 and connect the wiring board 6 to the connection wires of the stepped portion 31 of the package. By this connection, the chips 5 are electrically connected to the external circuit board via the electrode pins 32.

The opening of the package 3 is hermetically sealed by use of a cap 10 of iron-series alloy such as Kovar (trade name of Westinghouse Co.). A coating (not shown) of gold, for example, is formed to cover the wirings formed on the wiring board 6 in an area of the wiring board 6 on which the chips 5 are mounted.

A method for manufacturing the composite semiconductor device is explained with reference to FIGS. 2 to 4. First, a silicone rubber-series adhesive agent 2 of low elasticity is coated on the entire surface of the wiring board 6. The adhesive agent 2 is set in contact with the inner bottom surface of the package 3, heated and pressed to be cured so as to fix the wiring board 6 on the inner bottom surface of the package. Next, a silicone rubber-series or epoxy-series adhesive agent 4 of high thermal conductivity is coated on each of the entire rear surface of the chips 5 and disposed on an area of the wiring board 6 on which the chip is mounted. Then, the adhesive agent 4 is heated and pressed to be cured so as to fix the chips 5 on the wiring board 6. Thus, the silicon semiconductor wiring board used in the composite semiconductor device (MCM) is made large (approx. 50 mm square) in order to permit a plurality of chips to be mounted thereon. As a result, after curing of the adhesive agent, warp and residual stress may occur in the wiring board 6 by a difference between the thermal expansion coefficients of the wiring board 6 and the package 3. Therefore, in order to reduce the warp and residual stress, an adhesive agent of low elasticity is used.

As described above, the wiring board used in the composite semiconductor device is large and most of the chips, for example, CPU disposed in contact with the wiring board generate a large amount of heat. Therefore, an adhesive agent of low elasticity for reducing the warp and residual stress caused by a difference between the thermal expansion coefficient of the wiring board and the thermal expansion coefficient of the package when the chip is mounted is used to fix the wiring board on the package and an adhesive agent of high thermal conductivity for radiating heat generated by the chips is used to fix the chips on the wiring board. However, in general, as the adhesive agent, epoxy resin or synthetic resin of low elasticity such as silicone rubber is used. In order to make the adhesive agent have a high thermal conductivity, it is necessary to introduce metal particles into the adhesive agent, but if the metal particles are introduced, the low elasticity of the adhesive agent is degraded. Therefore, it becomes impossible to obtain an adhesive agent which satisfies both of the high thermal conductivity and low elasticity at the same time. As a result, when the wiring board is fixed on the package in the prior art, an adhesive agent which satisfies both of the high thermal conductivity and low elasticity at the same time cannot be used.

SUMMARY OF THE INVENTION

This invention has been made to solve the above problem and an object of this invention is to provide a composite semiconductor device having such a structure that the wiring board and package are bonded together to satisfy both of the high thermal conductivity and low elasticity at the same time.

This invention has a feature that when a semiconductor substrate having a plurality of semiconductor chips mounted thereon is bonded to a package of the composite semiconductor device, an adhesive agent of low elasticity is used in most part of the area and an adhesive agent of high thermal conductivity is used in the other area in which heat tends to be generated, or an adhesive agent is used only in the area in which heat tends to be generated so as to suppress generation of stress, thus making it possible to bond the semiconductor substrate to the package while attaining both of the high thermal conductivity and reducing the stress. That is, the semiconductor device of this invention includes a package and a semiconductor substrate having circuit wirings formed thereon and has a first feature that it includes a wiring board disposed on the inner bottom surface of the package, an adhesive agent disposed between the wiring board and the inner bottom surface of the package to fix the wiring board on the package, a wiring board constructed by a semiconductor substrate having circuit wirings formed thereon, a plurality of semiconductor elements formed on the wiring board and electrically connected to the circuit wirings of the wiring board, and a cap for hermetically sealing the opening of the package, an adhesive agent of high thermal conductivity is formed as the adhesive agent on the rear surface of that area of the wiring board on which at least one of the semiconductor elements is disposed, and an adhesive agent of low elasticity is formed as the adhesive agent on the rear surface of the other area of the wiring board.

The adhesive agent may be formed on the entire portion of the rear surface of the wiring board. The adhesive agent of high thermal conductivity may be disposed on the rear surface of the entire area of the wiring board on which the semiconductor elements are formed. The adhesive agent of high thermal conductivity is disposed on that portion of the rear surface of the wiring board on which those of the semiconductor elements which tend to generate a large amount of heat are mounted and the adhesive agent of low elasticity may be disposed on that portion of the rear surface of the wiring board on which those of the semiconductor elements which tend to generate a small amount of heat are mounted. Further, the semiconductor device of this invention includes a package and a semiconductor substrate having circuit wirings formed thereon and has a second feature that it includes a wiring board disposed on the inner bottom surface of the package, an adhesive agent disposed between the wiring board and the inner bottom surface of the package to fix the wiring board on the package, a circuit board constructed by a semiconductor substrate having circuit wirings formed thereon, a plurality of semiconductor elements formed on the wiring board and electrically connected to the wirings of the wiring board, and a cap for hermetically sealing the opening of the package, and the adhesive agent is formed only on the rear surface portion of that area of the wiring board on which the semiconductor elements are mounted.

As described above, in this invention, since the adhesive agent of high thermal conductivity is formed only on the area which tends to generate a large amount of heat, a connection structure for connection between the package and the semiconductor substrate which satisfies both of the high thermal conductivity and low elasticity at the same time can be obtained. Further, occurrence of the stress can be suppressed by reducing the area occupied by the adhesive agent.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 10 is a cross sectional view of a semiconductor device according to a second embodiment of the present invention;

FIG. 11 is a plan view of the wiring substrate in the second embodiment;

FIG. 12 is a cross sectional view of a semiconductor device according to a third embodiment of the present invention; and FIG. 13 is a plan view of the wiring substrate in the second embodiment.

DETAILED DESCRIPTION OF THE PREFERRED EMBODIMENTS

There will now be described an embodiment of this invention with reference to the accompanying drawings.

Figure 1A:
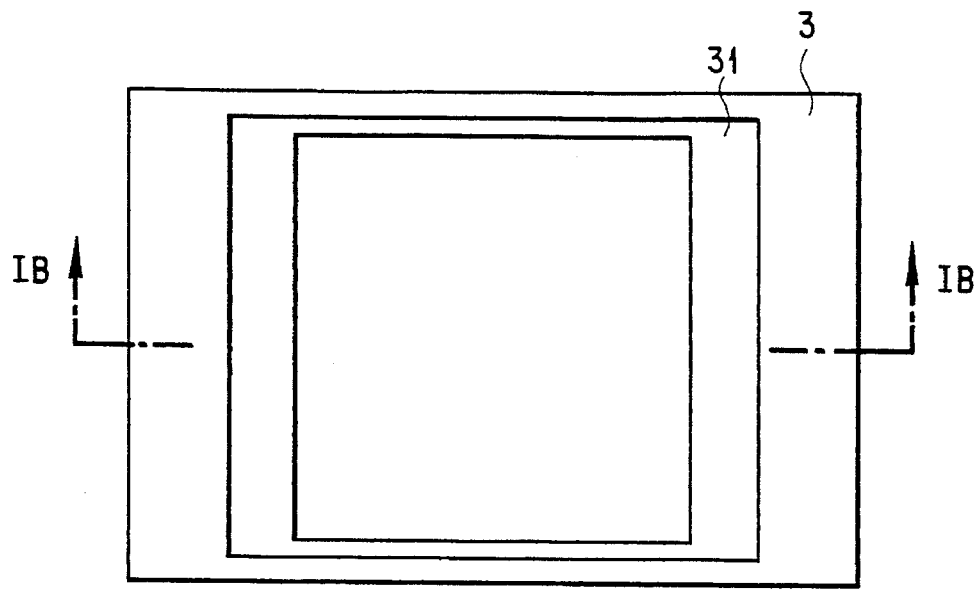
FIG. 1A is a plan view of a conventional semiconductor device and FIG. 1B is a cross sectional view of the semiconductor device.
Figure 1B:
Figure 2:
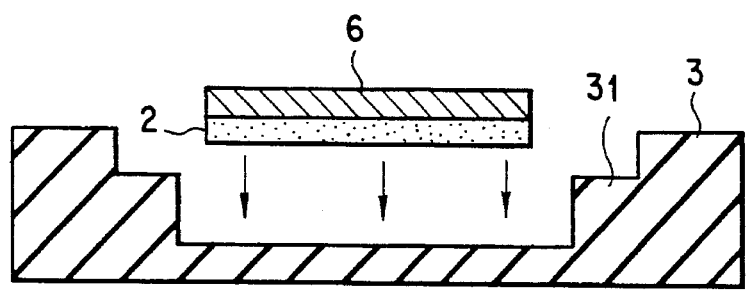
FIG. 2 is a cross sectional view of a conventional semiconductor device.
Figure 3:
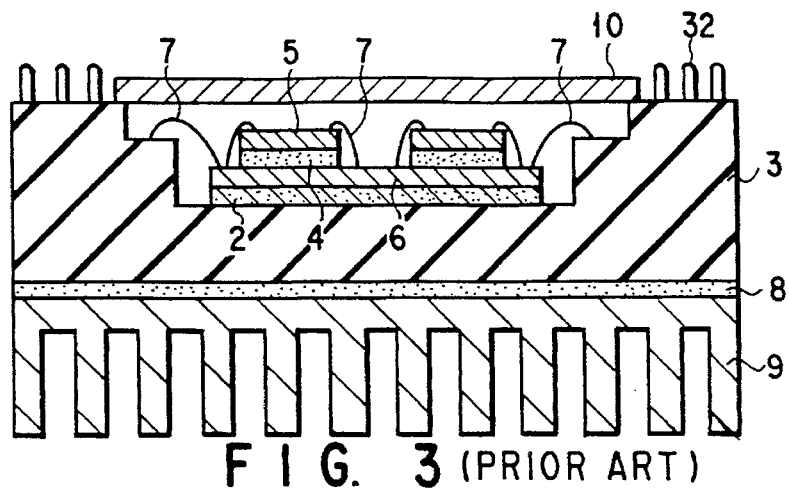
FIG. 3 is a cross sectional view of a conventional semiconductor device taken along the line III—III of FIG. 4.
Figure 4:
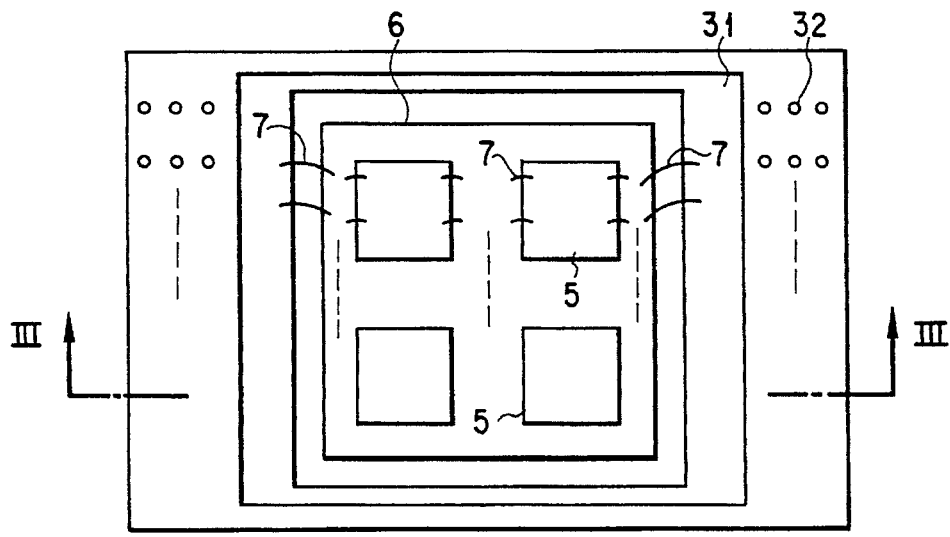
FIG. 4 is a plan view of the semiconductor device shown in FIG. 3.
Figure 5:
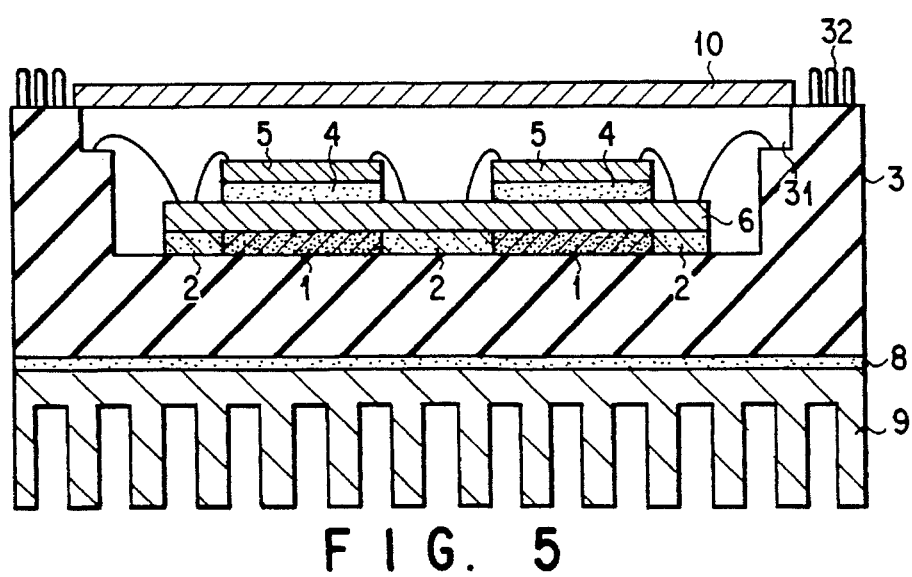
FIG. 5 is a cross sectional view of a semiconductor device according to a first embodiment of the present invention.
Figure 6A:
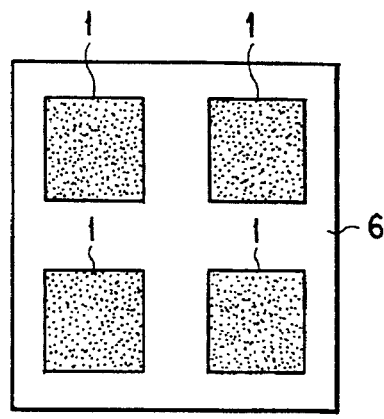
FIGS. 6A to 6C are diagrammatic plan views showing semiconductor structures in the steps of the manufacturing process of the semiconductor device shown in FIG. 5.
Figure 6B:
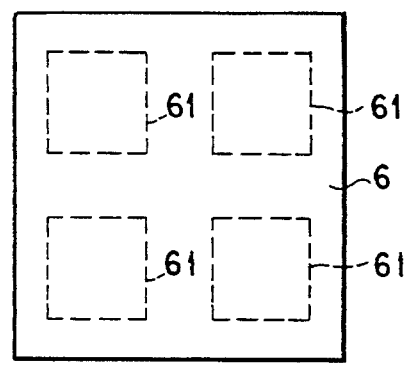
Figure 6C:
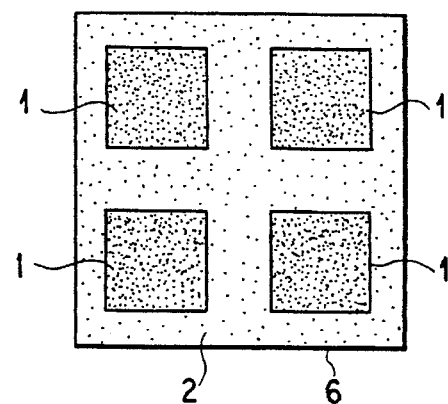
Figure 7:
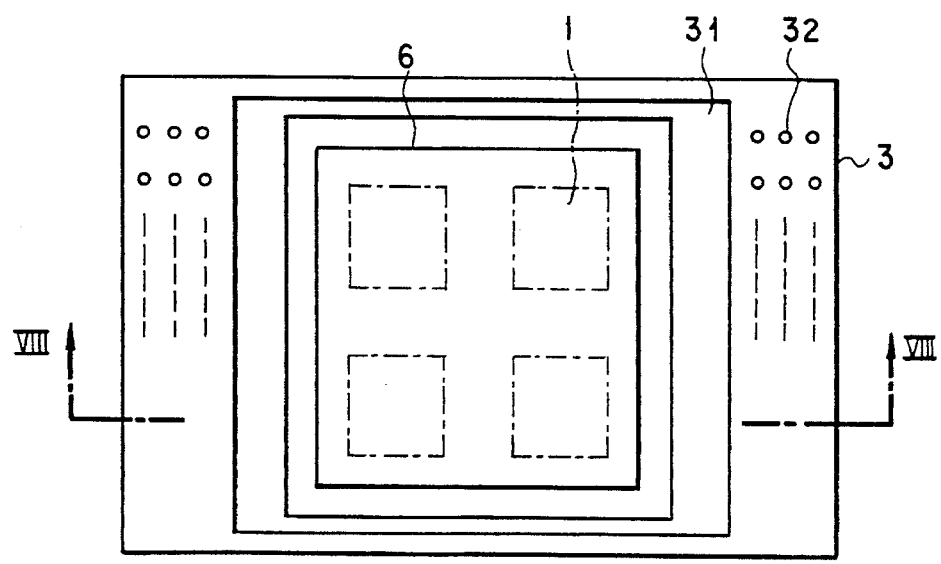
FIG. 7 is a diagrammatic plan view of the semiconductor structure obtained in one step of the manufacturing process of the semiconductor device shown in FIG. 5.
Figure 8:
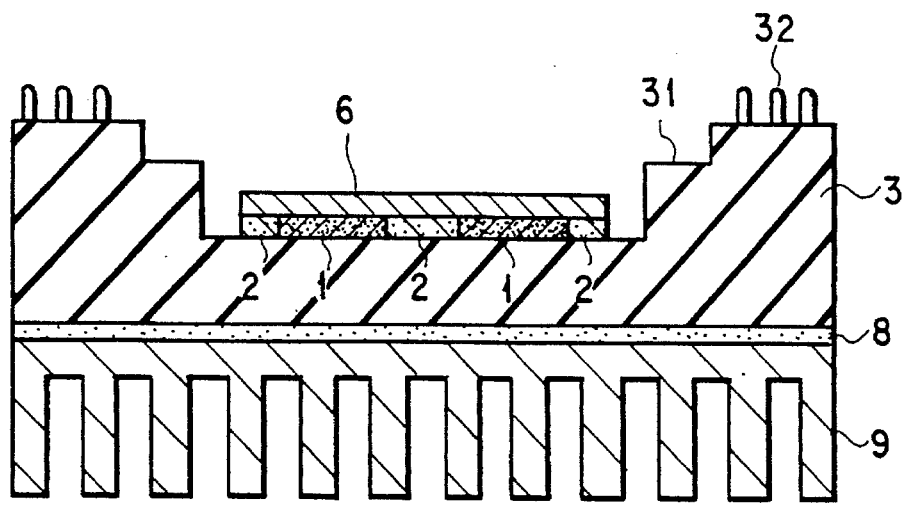
FIG. 8 is a diagrammatic cross sectional view of the semiconductor structure obtained in one step of the manufacturing process of the semiconductor device shown in FIG. 5.

First, a first embodiment of this invention is explained with reference to FIGS. 5, 6A to 6C and 7. FIG. 5 is a cross sectional view of a composite semiconductor device, FIGS. 6A to 6C and 7 are plan views showing semiconductor structures in the steps of the manufacturing process for forming the semiconductor device, and FIG. 8 is a cross sectional view of the semiconductor device. A stepped portion 31 is formed in the inner peripheral portion of a rectangular ceramic package 3 formed of alumina or the like and a wiring board 6 formed of a silicon semiconductor substrate or the like on which semiconductor chips 5 are formed and having multi-layered wirings (not shown) formed thereon is disposed on the inner bottom surface of the package. Further, connection wirings (not shown) are formed in the package 3 and the connection wirings are partially exposed at the stepped portion 31. Electrode pins 32 for mounting the semiconductor device on a circuit board such as a printed wiring board are disposed on the peripheral portion of the package 3. Although not shown in the drawing, the electrode pins 32 are connected to the connection wirings in the package 3. A heat radiation plate 9 formed of aluminum or copper is fixed on the rear surface of the package 3 by use of an adhesive agent 8 such as epoxy resin. As described before, the wiring board 6 is fixed on the inner bottom surface of the package 3 by use of an adhesive agent. Further, the semiconductor chips 5, for example, a CPU and memory element such as SRAM are mounted on the front surface of the wiring board 6 by use of adhesive agents 4 of high thermal conductivity.

The adhesive agent 4 is of epoxy resin series or silicone rubber series and particles of metal such as silver can be introduced therein in order to enhance the thermal conductivity. In order to connect the chips 5 to each other and connect them to an external circuit, bonding wires 7 of aluminum or gold are formed by the wire bonding method or the like to connect the chips 5 to the wiring board 6 and connect the wiring board 6 to the connection wirings on the stepped portion 31 of the package. The chips 5 are electrically connected to an external circuit board via the electrode pins 32 by means of the bonding wires. For example, the electrode pins 32 is formed of an iron-series alloy containing nickel by 42 weight percentage and the surface thereof is plated with gold or the like. The opening of the package 3 is hermetically sealed by a cap 10 of iron-series alloy such as Kovar, for example. The cap 10 is bonded to the package 3 by welding, for example. Naturally, heat is generated from the chips 5 during the operation of the semiconductor device. The heat is transmitted to the wiring board 6 via the adhesive agent 4, to the package 3 via the adhesive agent which bonds the wiring board 6 to the package 3, and radiated from the heat radiating plate 9 via the package 3.

Next, a method for manufacturing the semiconductor device according to this embodiment is explained with reference to FIGS. 6A to 6C, 7 and 8. As shown in the plan view of FIG. 7, the electrode pins 32 are arranged in a plurality of rows on the surfaces of both end portions of the package 3. In this embodiment, they are arranged in three rows, but in general, the electrode pins 32 may be arranged in one row or four or more rows. Further, the electrode pins are arranged only on both end portions of the package 3, but they can be arranged on the entire peripheral portion of the package. Further, the heat radiation plate 9 is attached to the rear surface of the package 3 by use of the adhesive agent 8 as shown in FIG. 8. First, adhesive agents 1 of high thermal conductivity are selectively coated on preset areas (four areas in this embodiment) of the rear surface of the wiring board 6 formed of a silicon semiconductor substrate and having multi-layered wirings (not shown) formed thereon (FIG. 6A). The adhesive agent is obtained by introducing particles of metal such as silver into silicone rubber, for example, and the elastic modulus thereof (equal to or larger than approx. $1.37 \times 10^8$ Pa (Pascal)) is larger than that of the silicone rubber itself and the thermal conductivity thereof is high (approx. 1.0 kW/mK (meter.Kelvin)). The preset areas correspond to the rear side portions of chip mounting areas 61 set on the front surface of the wiring board 6 as shown in FIG. 6B. After the adhesive agents 1 are coated, an adhesive agent 2 of low elasticity such as silicone rubber-series adhesive agent having an elasticity modulus smaller than approx. $9.8 \times 10^7$ Pa is selectively coated by use of a mask on that area of the rear surface on which the adhesive agent 1 is not coated, that is, on the rear surface area other than the area corresponding to the chip mounting areas (FIG. 6C).

The wiring board 6 on which the adhesive agent is coated is mounted on the inner bottom surface of the package 3 and fixed thereon by heating and pressing the adhesive agent. (FIG. 7). The order of the coating steps of the adhesive agent 1 of high thermal conductivity and the adhesive agent 2 of low elasticity can be reversed. Next, the chips 5 such as a CPU and memory on which adhesive agents 4 such as epoxy resin or silicone rubber are selectively coated are disposed on the chip mounting areas 61 on the front surface of the wiring board 6 with the adhesive agents 4 set in contact with the wiring board 6 and the adhesive agent 4 is cured by heating and pressing so as to fix the chip 5. In this embodiment, four chips 5 are formed, but more chips can be formed. For example, when chips of less than 5 mm square are mounted on the wiring board 6 of 50 mm square, 10 SRAMs can be formed for one CPU. A coating of gold or the like (not shown) is formed to cover the chip mounting area 61 of the wiring board 6 on which the chip 5 is mounted in order to protect the wirings formed on the wiring board 6. After this, as described before, the wiring board 6 and the connection wirings electrically connected to the electrode pins 32 and formed on the package 3 are connected to each other via bonding wires 7 such as gold or aluminum. Further, the chips 5 and the wiring board 6 are connected in the same manner by use of the bonding wires 7. Then, the metal cap 10 formed of iron alloy such as Kovar is welded on the opening portion of the package 3 so as to hermetically seal the package (FIG. 5).

Figure 9:
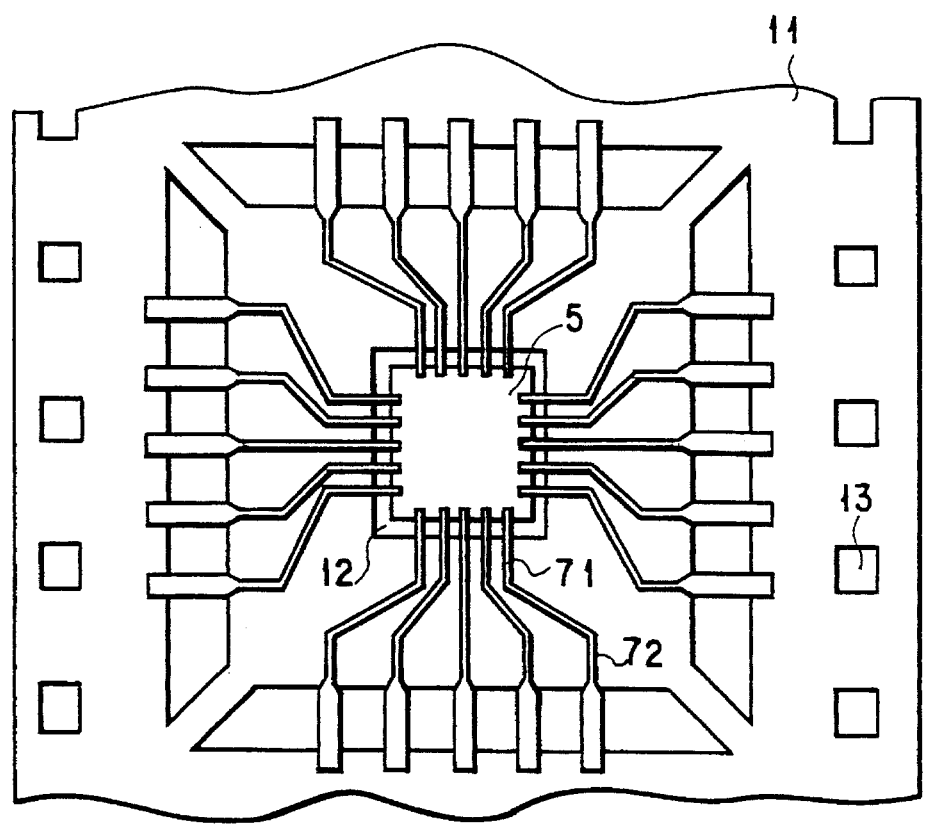
FIG. 9 shows a TAB tape used for the semiconductor device of the present invention.

In this embodiment, the bonding wires 7 are used to electrically connect the chips 5 to the wiring board 6, but a TAB tape can be used instead of the bonding wires. FIG. 9 is a plan view showing a TAB (Tape Automated Bonding) tape. Generally, one chip mounting portion is formed in the central area of the TAB tape and the outer lead end portions thereof are connected to circuit wirings of the wiring board. The TAB tape is used in the bonding method for superimposing conductive leads repeatedly formed on a tape-form film upon respective portions of the electrodes of the chip, connecting them together by a suitable means and thus simultaneously connecting a large number of wirings together, and the TAB tape has a chip mounting portion 12 formed in the central area of a film 11 and feeding holes 13 formed on both end portions thereof. After removing unnecessary portions of the tape, front end inner leads 71 of repeatedly formed leads are respectively connected to electrodes of the chip 5 fixed on the chip mounting portion 12 and the other end outer leads 72 which are continuous to the inner leads 71 are connected to electrodes (not shown) of the wiring board 6. Thus, the chip 5 mounted on the wiring board 6 fixed on the package 3 is electrically connected to the wiring board 3. This invention can be applied not only to the TAB tape with the above structure, but also a TAB tape having a plurality of chip mounting portions. This invention can sufficiently cope with a chip which is more highly integrated by utilizing the TAB tape.

As described before, the wiring board 6 is of approx. 50 mm square and the size thereof tends to be increased, but as the size of the wiring board is increased, the number of chips mounted thereon is increased and the heat generation amount becomes larger. When such a wiring board is fixed on a package of ceramic, for example, a stress caused by a difference between the thermal expansion coefficients of the wiring board and the package occurs between the wiring board and the package when heat is generated, thereby warping the wiring board. Therefore, in order to reduce the stress, an adhesive agent of low elasticity such as silicone rubber is disposed between them. However, such an adhesive agent of low elasticity is bad in the thermal conductivity and if an attempt is made to reduce the stress, the heat radiation property is deteriorated. In this embodiment, since the adhesive agent 1 of high thermal conductivity is disposed only on the rear surface portion of that area of the wiring board 6 having a large amount of heat generation on which the chip 5 is formed, the heat radiation property can be enhanced by use of a minimum amount of adhesive agent of high thermal conductivity without lowering the stress reducing characteristic. Since the coating area of the adhesive agent of high thermal conductivity used in the wiring board can be reduced to 6.25 or less when the coating area of the adhesive agent of low elasticity is 10, the amount of adhesive agent of high thermal conductivity used can be reduced. In a case where the wiring board is formed in the form of 50 mm square as in this embodiment and the adhesive agent for attaching the wiring board to the package is all formed of an adhesive agent of high thermal conductivity, the warp of approx. 60 to 70 μm occurs in the wiring board by heat generation during the operation of the semiconductor device. Further, in a case where the wiring board is attached to the package only by use of an adhesive agent of low elasticity, the warp of only approx. 10 to 20 μm occurs in the wiring board. The warp occurring in the wiring board when the wiring board is attached to the package by use of the adhesive agents of this invention becomes extremely closer to the warp occurring when the wiring board is attached to the package only by use of an adhesive agent of low elasticity.

Next, a second embodiment is explained with reference to FIGS. 10 and 11. FIG. 11 shows the rear surface of the wiring board and FIG. 10 is a cross sectional view which shows a package and a wiring board and chip mounted therein and in which the cap, electrode pins, heat radiating plate, bonding wires and the like are omitted. A wiring board 6 which is formed of a silicon semiconductor substrate having chips 51, 52 mounted thereon and on which multi-layered wirings (not shown) are formed is attached to the inner bottom surface of a rectangular ceramic package 3 formed of alumina or the like and having a stepped portion 31. A heat radiation plate (not shown) formed of aluminum or copper is fixed on the rear surface of the package 3 by use of an adhesive agent such as epoxy resin. The chip 51 such as a CPU which generates a relatively large amount of heat and the chip 52 such as an SRAM which generates a relatively small amount of heat are attached to the front surface of the wiring board 6 by use of an adhesive agent 4. The adhesive agent 4 is of epoxy resin series or silicone rubber series, for example, and particles of metal such as silver may be mixed into the adhesive agent to enhance the thermal conductivity thereof. The opening of the package 3 is hermetically sealed by a cap of iron-series alloy. In the former embodiment, as the adhesive agent for attaching the wiring board 6 to the inner bottom surface of the package 3, the adhesive agent 1 of high thermal conductivity and the adhesive agent 2 of low elasticity are used and the adhesive agent 1 of high thermal conductivity is always coated on the rear surface portion of the chip mounting area 61 of the wiring board 6, but in this embodiment, the adhesive agent 1 of high thermal conductivity is not always coated on the rear surface portion of the chip mounting area 61.

In a case where heat is generated from the chips during the operation, some of the chips may generate heat of an amount which is as small as negligible and some of the chips generate a large amount of heat which must be immediately radiated. In this embodiment, the adhesive agent 1 of high thermal conductivity is not always applied to a portion below the chip 52 such as an SRAM which does not generate much heat so as to sufficiently reduce the stress and the adhesive agent 1 of high thermal conductivity is always coated on the rear surface portion of the chip mounting area 61 of the wiring board 6 on which the chip 51 such as CPU generating a large amount of heat is mounted. Heat generated from the chip is transmitted to the wiring board 6 via the adhesive agent 4, to the package 3 via the adhesive agent 1 for attaching the wiring board 6 to the package 3, and radiated from the heat radiation plate via the package 3. The amount of adhesive agent of high thermal conductivity is further reduced than in the former embodiment.

Next, a third embodiment is explained with reference to FIGS. 12 and 13. FIG. 12 is a cross sectional view of a package and a wiring board and chip mounted in the internal portion thereof, FIG. 13 is a plan view which shows the rear surface of the wiring board and in which the cap, electrode pins, heat radiation plate, bonding wires and the like are omitted. A wiring board 6 which is formed of a silicon semiconductor substrate having a chip 5 mounted thereon and on which multi-layered wirings are formed is attached to the inner bottom surface of rectangular ceramic package 3 formed of alumina or the like and having a stepped portion 31. A heat radiation plate (not shown) formed of aluminum or copper is fixed on the rear surface of the package 3 by use of an adhesive agent such as epoxy resin. The chips 5 such as a CPU and SRAM are attached to the front surface of the wiring board 6 by use of an adhesive agent 4. The adhesive agent 4 is of epoxy resin series or silicone rubber series, for example, and particles of metal such as silver may be mixed into the adhesive agent to enhance the thermal conductivity. The opening of the package 3 is hermetically sealed by a cap of iron-series alloy.

In the first embodiment, as the adhesive agent for attaching the wiring board 6 to the inner bottom surface of the package 3, the adhesive agent 1 of high thermal conductivity and the adhesive agent 2 of low elasticity are used, the adhesive agent 1 of high thermal conductivity is always coated on the rear surface portion of the chip mounting area 61 of the wiring board 6, and either adhesive agent is coated on the entire portion of the rear surface of the wiring board 6, but in this embodiment, the adhesive agent is not applied to all of the rear surface portion of the wiring board 6 and the adhesive agent 1 of high thermal conductivity is coated only on the rear surface portion of the chip mounting area 61 of the wiring board 6. Even if the bonding area is small, the strength of bonding between the wiring board 6 and the package 3 is sufficiently high and the stress caused between the wiring board and the package by a difference in the thermal expansion coefficient is not so large because the area in which the adhesive agent is applied is small, and therefore the influence by the stress is not significant. Heat generated from the chip is transmitted to the wiring board 6 via the adhesive agent 4, to the package 3 via the adhesive agent 1 for attaching the wiring board 6 to the package 3, and radiated from the heat radiation plate via the package 3.

As described above, in this invention, since the adhesive agent of high thermal conductivity is applied to the rear surface portion of the wiring board corresponding to that area of the front surface of the wiring board on which the chip is formed as the adhesive agent for attaching the wiring board to the package, heat generated from the chip which is the heat generation source is efficiently radiated via the adhesive agent of high thermal conductivity. Further, the stress caused in the interface by a difference between the thermal expansion coefficients of the wiring board and the package when heat is generated from the chip can be efficiently alleviated by the adhesive agent of low elasticity used in this area since the adhesive agent of high thermal conductivity is applied only in the extremely limited area.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:

a package having an inner bottom surface and an opening;

a wiring board disposed on the inner bottom surface of the package and formed of a semiconductor substrate on which circuit wirings are formed;

a plurality of semiconductor elements formed on the wiring board and electrically connected to the circuit wirings of the wiring board, each semiconductor element including a surface area;

a first adhesive agent disposed between the wiring board and the inner bottom surface of the package to fix the wiring board on the package, the first adhesive agent having high thermal conductivity and being positioned in selected areas which are directly below the semiconductor elements, the size of each selected area being substantially equal to the surface area of the semiconductor element directly above the selected area;

a second adhesive agent disposed between the wiring board and the inner bottom surface of the package to fix the wiring board on the package, the second adhesive agent having low elasticity and being positioned in an area other than the selected areas; and a cap for hermetically sealing the opening of the package.

2. The semiconductor device of claim 1, wherein at least one of the semiconductor elements generates a large amount of heat.

3. A semiconductor device comprising:

a package having an inner bottom surface and an opening;

a wiring board disposed on the inner bottom surface of the package and formed of a semiconductor substrate having circuit wirings formed thereon;

a plurality of semiconductor elements formed on the wiring board and electrically connected to the circuit wirings of the wiring board, each semiconductor element including a surface area;

an adhesive agent disposed between the wiring board and the inner bottom surface of the package to fix the wiring board on the package, the adhesive agent having high thermal conductivity and being positioned in selected areas which are directly below the semiconductor elements, the size of each selected area being substantially equal to the surface area of the semiconductor element directly above the selected area; and a cap for hermetically sealing the opening of the package.

* * * * *